(12) United States Patent
Lu et al.

(10) Patent No.: US 6,740,192 B1
(45) Date of Patent: May 25, 2004

(54) JOINING ELECTROCONDUCTIVE MATERIALS WITH ELECTROCONDUCTIVE ADHESIVE CONTAINING EPOXIDE-MODIFIED POLYURETHANE

(75) Inventors: Daoqiang Lu, Atlanta, GA (US); Ching-Ping Wong, Duluth, GA (US)

(73) Assignee: Georgia Tech Research Corp., Atlanta, GA (US)

(*) Notice: Subject to any disclaimer, the term of this patent is extended or adjusted under 35 U.S.C. 154(b) by 0 days.

(21) Appl. No.: 09/671,963

(22) Filed: Sep. 27, 2000

Related U.S. Application Data

(60) Provisional application No. 60/167,202, filed on Nov. 23, 1999, and provisional application No. 60/156,243, filed on Sep. 27, 1999.

(51) Int. Cl.$^7$ .............. C09J 11/04; C09J 11/06; C09J 163/00; C09J 175/04
(52) U.S. Cl. ............ 156/330; 523/458; 525/399; 525/407; 525/410; 525/423; 525/438; 525/454; 525/463
(58) Field of Search .............. 523/458; 525/454, 525/399, 407, 410, 423, 438, 463; 156/330

(56) References Cited

U.S. PATENT DOCUMENTS

| | | | |
|---|---|---|---|
| 3,624,178 A | * 11/1971 | Lohse | |
| 4,013,701 A | 3/1977 | Jabs et al. | |
| 4,242,489 A | 12/1980 | Findeisen et al. | 528/73 |
| 4,465,836 A | 8/1984 | Buschhaus et al. | 548/110 |
| 4,613,685 A | 9/1986 | Klein et al. | 560/330 |
| 4,613,687 A | 9/1986 | Knöfel et al. | 560/351 |
| 4,845,136 A | * 7/1989 | Saito et al. | 523/451 |
| 4,914,238 A | 4/1990 | Sanders | 564/720 |
| 4,943,604 A | * 7/1990 | Okuri et al. | 523/428 |
| 5,194,502 A | * 3/1993 | Saito et al. | 525/111 |
| 5,198,065 A | * 3/1993 | Eadara | 156/315 |
| 5,310,830 A | 5/1994 | Okitsu et al. | 525/502 |
| 5,514,747 A | 5/1996 | Hsu et al. | 524/590 |
| 5,686,541 A | * 11/1997 | Wang et al. | 525/528 |
| 5,891,367 A | 4/1999 | Basheer et al. | |

FOREIGN PATENT DOCUMENTS

| | | | |
|---|---|---|---|
| JP | 49-97052 A | * | 9/1974 |
| JP | 50-35232 A | * | 4/1975 |
| JP | 60-206882 A | * | 10/1985 |
| JP | 60-235877 A | * | 11/1985 |
| JP | 1628508 A1 | * | 5/1996 |

OTHER PUBLICATIONS

Zwolinski, M., et al., Electrically Conductive Adhesives for Surface Mount Solder Replacement, Adhesives in Electronics '96, Second International Conference on Adhesive Joining and Coating Technology in Electronics Manufacturing; Jun. 3–5, 1996, Stockholm, Sweden.

Wong, C.P., et al., Fundamental Study of Electrically Conductive Adhesives (ECAs), The First IEEE International Symposium on Polymeric Electronics Packaging, Oct. 26–30, Louis De Geer Congress Center; Norrköping, Sweden, PEP'97.

Vincent, M.B., et al., Enhancement of Underfill Performance for Flip–Chip Applications by Use of Silane Additives, IEEE 48$^{th}$ Electronic Components Technology Conference (1998).

* cited by examiner

*Primary Examiner*—Robert Sellers
(74) *Attorney, Agent, or Firm*—Todd Deveau; Charles Vorndran; Thomas, Kayden, Horstemeyer & Risley LLP

(57) ABSTRACT

A method of joining electrically conductive materials comprises:

Applying an electrically conductive adhesive to at least one electrically conductive material(s), wherein the electrically conductive adhesive is prepared from an epoxide-modified polyurethane, a cross-linking agent, an adhesion promotor and a conductive filler; and joining the electrically conductive material(s) with the applied adhesive to a substrate and curing the adhesive.

6 Claims, No Drawings

JOINING ELECTROCONDUCTIVE MATERIALS WITH ELECTROCONDUCTIVE ADHESIVE CONTAINING EPOXIDE-MODIFIED POLYURETHANE

This application claims priority to provisional U.S. applications, Ser. No. 60/156,243, filed on Sep. 27, 1999 and Ser. No. 60/167,202, filed on Nov. 23, 1999.

BACKGROUND OF THE INVENTION

1. Field of the Invention

This invention relates to novel electrically conductive adhesives for solder replacement in electronics packaging applications. More specifically, the present invention relates to novel electrically conductive adhesives which are fabricated using epoxide-modified polyurethane (EPU) resins and show superior impact performance and very stable contact resistance with non-noble metal finished components.

2. Description of the Related Art

Soldering processes with tin/lead solders (Sn/Pb) are standard interconnection technologies of electronic components on printed circuit boards (PCBs). The most common reflow soldering process for the surface mount technology (SMT) uses tin/lead solder pastes. However, because of the lead in the tin/lead solder pastes, this procedure is considered to be environmentally harmful. Lead is well-known hazard to human health. Even small quantities can damage the brain, nervous system, liver, and kidneys when ingested. When Sn/Pb solders are disposed in landfills, lead can leach into soils and pollute ground water. Accordingly, pressure to remove or minimize the use of lead is steadily building. Most European communities, in fact, have proposed a ban on the landfill disposal of electronic products containing leaded printed circuit boards, as well as on the sale of products containing the metal. In the United States, consumer electronics are identified as the second largest source of lead (30 percent) in the municipal solid waste stream, after lead-acid batteries (65 percent) which are already being separated from t prior to disposal. Therefore, lead-free and environmentally sound interconnect bonding processes are urgently needed. Among the possibilities are electrically conductive adhesives.

A great deal of effort has been made to use electrically conductive adhesives to replace conventional tin/lead solders in both rigid and flexible substrate applications in order to reduce the adverse effects of lead and the organic solvents which are used to clean the flux. Compared to traditional lead-bearing solders, electrically conductive adhesives offer many advantages: low processing temperature, fine pitch capability, lower sensitivity to thermomechanical stresses, environmentally friendly, and simple processing. Even though electrically conductive adhesives do not have the conductivity of metals and solders, their conductivity is adequate for many electrical circuits. However, limitations and concerns do exist.

Surface mount electronic packages are subjected to significant shocks during assembly, handling and throughout product life. A package can not survive such an impact without desirable impact performance. Therefore, impact strength is one of critical properties of electrically conductive adhesives. Existing conductive adhesives typically have poor impact performance. When they are used in surface mount technology, the surface mount components fall apart from the substrate when the package experiences a sudden impact.

In 1996, the National Center of Manufacturing and Science (NCMS) evaluated 25 commercial electrically conductive adhesives as solder replacement in terms of contact resistance and impact strength. It found that none of the commercial conductive adhesives tested have adequate impact strength. Therefore, there exists a need in the art for the development of new conductive adhesives with desirable impact performance.

Polyurethane materials exhibit high toughness and good adhesion, but difficulties in working with polyurethane resins has rendered their use impractical. Therefore, there exists a need in the art for a polymeric material having high toughness and good adhesion, while still being practical for use in polyurethane adhesives.

U.S. Pat. No. 3,624,178 to Allscheil, et al., discloses epoxide-modified polyurethanes for use as coating agents, laminates, paints, adhesives and as insulating compounds for the electrical industry. The reference does not suggest using the polyurethanes in electrically conductive adhesives.

Accordingly, it is an object of the present invention to provide electrically conductive adhesives with superior impact performance and stable electrical contact resistance with non-noble metals.

It is another object of the present invention to provide electrically conductive adhesives with superior impact performance and stable electrical contact resistance with non-noble metals comprising an epoxide-modified polyurethane resin.

SUMMARY OF THE INVENTION

The present invention relates to novel electrically conductive adhesives made with epoxide-modified polyurethane resins. The novel adhesives comprise (a) a novel epoxide-modified polyurethane resin; (b) a cross-linking agent; (c) an adhesion promoter; and (d) a conductive filler. The electrically conductive adhesive is applied to at least one electrically conductive material(s) which is joined to a substrate and cured. The epoxide-modified polyurethanes useful in the electrically conductive adhesives of the present invention have a structure selected from:

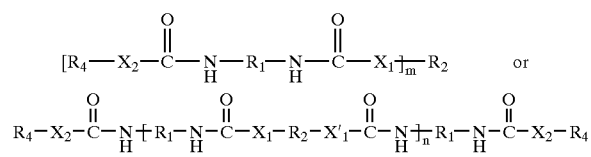

where m is 2 or 3; n is one or greater, $R_1$ is a substituted or unsubstituted aliphatic hydrocarbon radical, a substituted or unsubstituted cycloaliphatic hydrocarbon radical, a substituted or unsubstituted aromatic hydrocarbon radical, or a substituted or unsubstituted araliphatic hydrocarbon radical; $R_2$ is a substituted or unsubstituted aliphatic hydrocarbon radical, a substituted or unsubstituted cycloaliphatic hydrocarbon radical, a substituted or unsubstituted alkoxy radical, a substituted or unsubstituted polyester; or a substituted or unsubstituted polyether; $R_4$ is either:

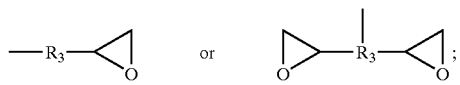

$R_3$ is a substituted or unsubstituted aliphatic hydrocarbon radical, a substituted or unsubstituted cycloaliphatic hydrocarbon radical, a substituted or unsubstituted alkoxy radical, a substituted or unsubstituted polyester, or a substituted or unsubstituted polyether; and $X_1$, $X'_1$ and $X_2$ are either a single bond, —O—; —COO—; —NH—; or —S—.

The cross-linking agent is any compound suitable for hardening the composition, but is preferably a carboxylic acid anhydride cross-linker.

The adhesion promoter is a material which promotes the adhesion between the substrate and the adhesive. Exemplary adhesion promoters include organofinctional silane adhesion promoters. The adhesion promoter material is present in the electrically conductive adhesive composition in an amount between 0.02 to 10 weight percent. Preferably the composition contains between 0.1 to 2 weight percent.

The conductive filler is any solid powder which has a high electrical conductivity. The fillers include, but are not limited to silver, nickel, copper, aluminum, palladium, platinum, gold and other alloys, or carbon black, carbon fiber and graphite. The filler can be in any form capable of being incorporated into the adhesive, including powder or flake form. The preferred powder is silver flakes. The conductive adhesive composition of the present invention comprises 5 to 95 weight percent of a conductive filler. Preferably, the composition comprises 50 to 80 percent of metal fillers.

The adhesive of the present invention may optionally include one or more of (e) an epoxy resin; (f) a catalyst; and (g) a diluent.

Epoxy resins include, but are not limited to, bisphenol A, bisphenol F, cycloaliphatic, biphenyl, naphthalene and novolac type epoxies. A preferable epoxy resin is bisphenol F. The epoxy resin is preferably present in the adhesive composition from about 0 to 80 weight percent.

Exemplary catalysts include, but are not limited to, imidazoles, tertiary amines and ureas. The formulation of the present invention further may contain from 0 to 10 weight percent, preferably 0 to 2 weight percent of a catalyst.

A reactive or nonreactive diluent may be used for some formulations with high viscosity. Examples of reactive diluents include, but are not limited to, glycidyl ethers. The composition of the present invention may contain between 0 to 50 weight percent of a diluent.

DETAILED DESCRIPTION OF THE INVENTION

1. Definitions and Nomenclature

Before the methods and compounds of the present invention are described in more detail it is to be understood that this invention is not limited to specific compounds, and as such may, of course, vary. It is also to be understood that the terminology used herein is for the purpose of describing particular embodiments only and is not intended to be limiting.

It must be noted that, as used in the specification and the appended claims, the singular forms "a," "an" and "the" include plural referents unless the context clearly dictates otherwise.

In this specification and in the claims that follow, reference will be made to a number of terms which shall be defined as follows.

The term "urethane" is used herein in its conventional sense to denote organic compounds containing a recurring —O—(CO)—NH— linkage. The term "polyurethane" is intended to mean a polymer, either a homopolymer or copolymer, containing a plurality of urethane units as just defined.

The term "active hydrogen" as used herein refers to hydrogen atoms which react positively in the well-known Zerevitinov test. The Zerevitinov test is the reaction of an organic compound containing active hydrogen atoms with methylmagnesium halide to give methane, which is collected and determined volumetrically. Representative of groups containing active hydrogen atoms are —OH, —COOH, —SH and —NHR where R can be hydrogen, alkyl, cycloalkyl, aryl aromatic and the like.

The term "alkyl" as used herein refers to a branched, unbranched or cyclic saturated hydrocarbon group of 1 to 26 carbon atoms, such as methyl, ethyl, n-propyl, isopropyl, n-butyl, isobutyl, t-butyl, octyl, decyl, tetradecyl, hexadecyl, eicosyl, tetracosyl and the like. Preferred alkyl groups herein contain 1 to 10, more typically 1 to 8, carbon atoms. The term "lower alkyl" intends an alkyl group of one to six carbon atoms, preferably one to four carbon atoms. The alkyl groups present on the polymers described herein may be unsubstituted or they may be substituted with one or more functional groups, e.g., amine, hydroxyl, an olefinic group such as a vinyl or an allyl group, or the like.

The term "alkylene" as used herein refers to a difunctional saturated branched or unbranched hydrocarbon chain containing from 1 to 26 carbon atoms. "Lower alkylene" refers to alkylene linkages containing from 1 to 6 carbon atoms, and includes, for example, methylene (—$CH_2$—), ethylene (—$CH_2CH_2$—), propylene (—$CH_2CH_2CH_2$—), 2-methylpropylene (—$CH_2$—$CH(_3)$—$CH_2$—), hexylene (—$(CH_2)_6$—), and the like.

The term "alkoxy" refers to an alkyl group as defined above bound through an ether linkage, typically to a carbon atom. "Lower alkoxy" intends an alkoxy group containing one to six, more preferably one to four, carbon atoms.

The term "cycloalkyl" refers to a saturated hydrocarbon ring group having from 3 to 8 carbon atoms, and includes, for example, cyclopropyl, cyclobutyl, cyclohexyl, methylcyclohexyl, cyclooctyl, and the like. Typically, however, cycloalkyl species will contain 5 or 6 carbon atoms.

The term "amino" intends an amino group —NH2. The term "amino" is thus intended to include primary amino —NH2, "alkylamino" (i.e., a secondary amino group containing a single alkyl substituent), and "dialkylamino" (i.e., a tertiary amino group containing two alkyl substituents).

"Halo" or "halogen" refers to fluoro, chloro, bromo or iodo, and usually relates to halo substitution for a hydrogen atom in an organic compound. Of the halos, chloro and fluoro are generally preferred. "Branched" refers to those carbon chains having at least one tertiary or quaternary aliphatic carbon atom. "Unbranched" refers to a structure where the carbon chain does not have any tertiary or quaternary aliphatic carbon atoms.

"Optional" or "optionally" means that the subsequently described event or circumstance may or may not occur, and that the description includes instances where said event or circumstance occurs and instances where it does not. For example, the phrase "optionally substituted alkyl group" means that the alkyl group may or may not be substituted and that the description includes both unsubstituted alkyl and alkyl where there is substitution. Similarly, a process which is "optionally" carried out in the presence of a particular chemical agent means that such an agent may or may not be present.

2. The EPU Resin

The preferred epoxide modified polyurethanes of the present invention, are of the general structure:

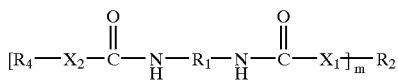
(I)

where m can be 2 or 3; and preferably equal to 2.

Alternatively, the novel EPUs can be represented by the formula:

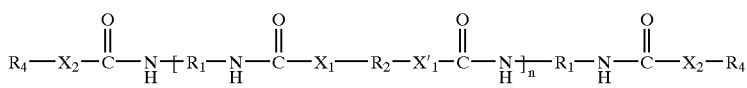
(II)

n can be any integer equal to or greater than one, and is preferably equal to 1.

One of skill in the art will recognize that the preferred compounds of formula I (m=2) are the same as the preferred compounds of formula II (n=1) where $X_1=X'_1$; or in cases where $R_2$ is an —O— terminated moiety (such as a polyether); $X'_1$ attached to that terminus is a single bond; and $X_1$ attached to the opposite terminus is —O—.

$R_1$ can be a substituted or unsubstituted aliphatic hydrocarbon radical having 2 or more carbon atoms; a substituted or unsubstituted cycloaliphatic hydrocarbon radical having 4 or more carbon atoms; a substituted or unsubstituted aromatic hydrocarbon radical having 6 or more carbon atoms; or a substituted or unsubstituted araliphatic hydrocarbon radical having 7 or more carbon atoms.

$R_1$ is preferably selected from the group consisting of the following hydrocarbon radicals:

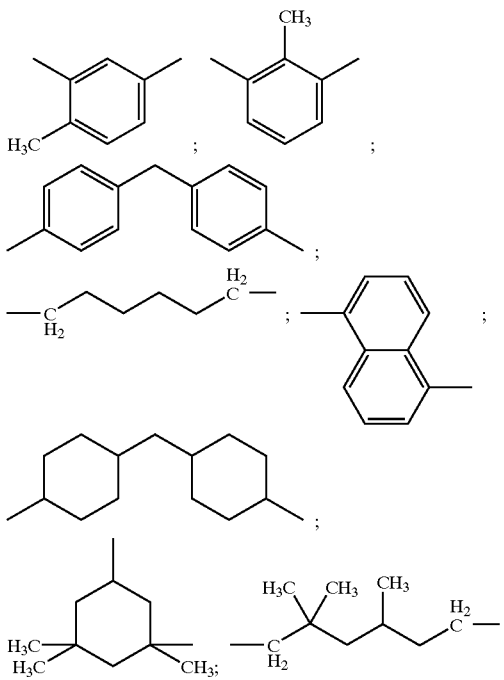

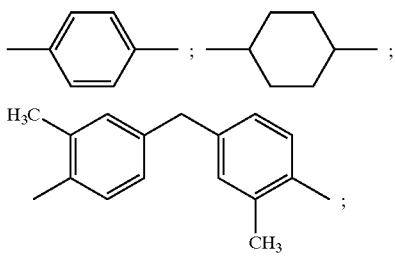

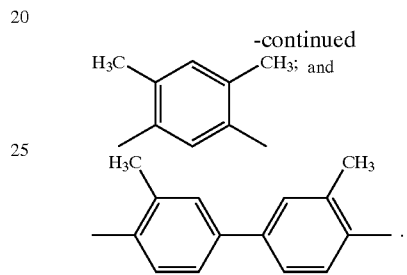

$R_2$ can be a substituted or unsubstituted aliphatic hydrocarbon radical having 2 or more carbon atoms; a substituted or unsubstituted cycloaliphatic hydrocarbon radical having 4 or more carbon atoms; a substituted or unsubstituted alkoxy, a substituted or unsubstituted polyester; or a substituted or unsubstituted polyether.

$R_2$ is preferably a polyester or polyether radical. Most preferably, $R_2$ is a polyether and the most preferred polyether radical is:

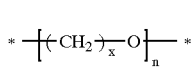
(V)

where n is an integer greater than 1.

$R_4$ is either

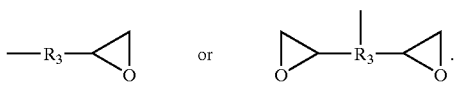
(III, IV)

$R_3$ can be a substituted or unsubstituted aliphatic hydrocarbon radical having 2 or more carbon atoms; a substituted or unsubstituted cycloaliphatic hydrocarbon radical having 4 or more carbon atoms; a substituted or unsubstituted alkoxy, a substituted or unsubstituted polyester; or a substituted or unsubstituted polyether.

Preferably, $R_3$ is a polyether or a $C_{1-6}$ alcyl. Most preferably, $R_3$ is selected from the group consisting of methyl and —$CH_2$—O—$CH_2CHCH_2$—O—$CH_2$—.

$X_1$, $X'_1$, and $X_2$ are selected independently from the group consisting of a single bond, —O—; —COO—; —NH—; and —S—. Preferably, $X_1$, $X'_1$, and $X_2$ are —O—. However, if $R_2$ is a —O— terminated moiety (such as a polyether) then $X'_1$ attached to that terminus is a single bond and $X_1$ attached to the opposite terminus is —O—.

3. Synthesis of the EPU Compounds

The epoxide-modified polyurethanes according to the present invention are prepared by reacting (a) a polyisocyante, preferably a diisocyanate, with (b) a compound containing at least two active-hydrogen groups, preferably a difunctional or trifunctional polyhydroxyl compound, most preferably the corresponding polyhydroxy-polyester or polyhydroxypolyether. The product of reacting (a) and (b) is then reacted with (c) a compound having one or more epoxide groups and an active hydrogen; and, optionally, (d) other auxiliaries and additives known to those skilled in the chemistry of polyurethane elastomers.

Any organic polyisocyanates (compound (a)) corresponding to the general formula $R_1$—$(NCO)_p$, where p is greater than 1, and where $R_1$ is as defined above, can be used in the process according to the invention. The polyisocyanate (a), is preferably a diisocyanate corresponding to the formula:

$$OCN-R_1-NCO \quad (VI)$$

Suitable aliphatic or cycloaliphatic diisocyanates are, for example, tetramethylene diisocyanate, pentamethylene diisocyanate, hexamethylene diisocyanate, 1,3-lcyclopentylene diisocyanate, 1,4-cyclohexylene diisocyanate, 1,2-cyclohexylene dilsocyanate, hexahydroxylylene diisocyanate, 4,4'-dicyclohexyl diisocyanate, 1,2-di-(isocyanatomethyl)-cyclobutane, 1,3-bis-(isocyanatopropyl)-2-methyl-2-propyl propane, 1-methyl-2,4-diisocyanatocyclohexane, 1-methyl-2,6diisocyanatocyclohexane, bis-(4-isocyanatocyclohexyl)-methane, 1,4dusocyanatocyclohexane and 1,3-diisocyanatocyclohexane 2,2,4-trimethylhexamethylene diisocyanate, or 3,3,5-trimethyl-5-isocyanatomethyl cyclohexyl isocyanate ("isophorone diisocyanate").

Preferred diisocyanates include compounds of the formula where $R_1$ is:

$$-R_5-R_6-R_7- \quad (VII)$$

where $R_5$ is selected from the group consisting of cyclohexyl, cyclohexyl mono-substituted with $X_5$, cyclohexyl di-substituted with $X_5$, and cyclohexyl tri-substituted with $X_5$;

$R_6$ is selected from the group consisting of a single bond and lower alkylenes; preferably methylene;

$R_7$ is selected from the group consisting of single bond, cyclohexyl, cyclohexyl mono-substituted with $X_5$, cyclohexyl di-substituted with $X_5$, and cyclohexyl tri-substituted with $X_5$; and $X_5$ is selected from the group consisting of lower alkyls, with methyl being the most preferred. If $R_7$ is a single bond, then it is preferred that $R_6$ also be a single bond.

Accordingly, the most preferred diisocyanate compounds include hexamethylene diisocyanate, 4,4'-dicyclohexyl diisocyanate, 1,4-diisocyanatocyclohexane, and 3,3,5-triethyl-5isocyanatomethyl cyclohexyl isocyanate ("isophorone diusocyanate").

The polyisocyanate is reacted with an active hydrogen-containing compound containing m active hydrogen groups (compound (b)) of the formula:

$$R_2-(X_3)_m \quad (VIII)$$

where m is 2 or 3; $R_2$ is an m-valent residue as defined above; and $X_3$ is an active hydrogen-containing group corresponding to the formula $HX_1$—, with H being the active hydrogen and $X_1$ is as defined above. M is preferably equal to 2. Alternatively, the active hydrogen-containing compound corresponds to the formula:

$$X_3-R_2-X'_3 \quad (IX)$$

where $R_2$ and $X_3$ are as defined above; and $X'_3$ is an active hydrogen-containing group corresponding to the formula $HX'_1$; where the H is an active hydrogen and $X'_1$ is as defined above. However, if R2 is a —O— terminated moiety (such as a polyether) and $X'_1$ attached to that terminus in formula (II) is a single bond, then $X_3$ is —OH and $X'_3$ is H, rather than $HX'_1$.

Suitable active hydrogen-containing compounds are well known in polyurethane chemistry and must contain at least two hydrogen atoms capable of reacting with isocyanates. Active hydrogen-containing groups include amino groups, thiol groups, carboxyl groups, and hydroxyl groups.

The preferred active hydrogen-containing compounds (b) are polyhydroxyl compounds and in particular compounds which contain 2 to 3 hydroxyl groups. Specific examples include polyhydric alcohols, polyesters, polyethers, polythioethers, polyacetals, polycarbonates or polyester amides containing at least two, preferably from 2 to 3 hydroxyl groups, of the type commonly used in the production of homogeneous and cellular polyurethanes.

Examples of suitable polyhydric alcohols include ethylene glycol, 1,2-propylene glycol, 1,4-butane diol, 1,6-hexane diol, glycerol, trimethylol propane, erythritol, pentaerythritol, sorbital, sucrose and the like.

Examples of suitable polyesters containing hydroxyl groups include reaction products of polyhydric, preferably dihydric and optionally trihydric alcohols, with polyvalent, preferable divalent, carboxylic acids. Instead of the free polycarboxylic acids, the corresponding polycarboxylic acid anhydrides or esters of lower alcohols or mixtures thereof can also be used for the production of the polyesters. The polycarboxylic acids can be aliphatic, cycloaliphatic, aromatic and/or heterocyclic, and can optionally be substituted, for example, by halogen atoms, and/or they can be unsaturated. Examples of these polycarboxylic acids are succinic acid, adipic acid, suberic acid, azelaic acid, sebacic acid, phthalic acid, isophthalic acid, trimellitic acid, phthalic acid anhydride, tetrahydrophthalic acid anhydride, hexahydrophthalic acid anhydride, tetrachlorphthalic acid anhydride, endomethylene tetrabydrophthalic acid anhydride, glutaric acid anhydride, maleic acid, maleic acid anhydride, fumaric acid, dimeric and trimeric fatty acids, such as oleic acid, optionally in admixture with monomeric fatty acids, terephthalic acid dimethyl ester, terephthalic acid-bis-glycol ester. Examples of suitable polyhydric alcohols include ethylene glycol 1,2- and 1,3-propylene glycol, 1,4 and 2,3-butylene glycol, 1,6-hexane diol, 1,8-octane diol, neopentyl glycol, cyclohexane dimethanol (1,4-bis-hydroxymethyl-cyclohexane), 2-methyl-1,3-propane diol, glycerol, trimethylol-propane, 1,2,6-hexane triol, 1,2,4-butane triol, trimethylolethane, pentaerythritol, quinitol, mannitol, sorbitol, methyl glycoside, diethylene glycol, triethylene gylcol, tetraethylene glycol, polyethylene glycols, dipropylene glycol, polypropylene glycols, polytetramethylene glycol, polyoxypropylene glycols, dibutylene glycol and polybutylene glycols. The polyesters may contain terminal carboxyl groups. Polyesters for lactones, for example, ε-caprolactone, or hydroxycarboxylic acids, for example, ω-hydroxycaproic acid, can be used.

The polyethers suitable for use in accordance with the invention, are also those of the type known and may be obtained, for example, by the polymerization of epoxides, such as ethylene oxide, propylene oxide, butylene oxide, tetrahydrofuran, styrene oxide or epichlorhydrin for example, in the presence of $BF_3$, or by the chemical addition of these epoxides, optionally in admixture with starter components with reactive hydrogen atoms such as water, ethylene glycol, 1,3- or 1,2-propylene glycol, trimethylolpropane, 4,4'-dihydroxydiphenylpropane, aniline, ammonia, ethanolamine and ethylene diamine.

Among the polythio-ethers suitable for use include the condensation products of thiodiglycol with itself and/or with other glycols, dicarboxylic acids, formaldehyde, aminocarboxylic acids or anrinoalcohols. Depending on the co-components, these products are polythio-mixed-ethers, polythio-ether-esters or polythio-ether-ester-amides.

Suitable polyacetals include those compounds which can be obtained from glycols, such as diethylene glycol, triethylene glycol, 4,4'-dioxethoxy diphenyl-dimethylmethane and hexane diol, and formaldehyde. Polyacetals suitable for the purpose of the invention can also be obtained by polymerizing cyclic acetals.

Suitable polycarbonates containing hydroxyl groups are known and include those obtained by reacting diols, such as 1,3-propane diol, 1,4-butane diol and/or 1,6-hexane diol, diethylene glycol, triethylene glycol and tetraethylene glycol, with diarylcarbonates, such as diphenylcarbonate, or phosgene.

Examples of polyester amides and polyamides include the predominantly linear condensates obtained from polyvalent saturated and unsaturated carboxylic acids or their anhydrides and polyhydric saturated and unsaturated amino alcohols, diamines, polyamnines and mixtures thereof.

Polyhydroxyl compounds already containing urethane or urea groups, and modified natural polyols, such as caster oil, carbohydrates and starch, can also be used. The addition products of alkylene oxides with phenol-formaldehyde resins or even with urea-formaldehyde resins can also be used in accordance with the invention.

The most preferred active hydrogen-containing compounds are represented by the formula:

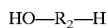 (X)

where $R_2$ is as defined in formula I.

The most preferred active hydrogen-containing compound containing at least two active hydrogen groups (compound (b)) is known as PolyTHF (m in formula (VIII) is 4), and is represented by the formula:

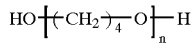 (XI)

The polyurethane addition reaction described above is preferably carried out by the known prepolymer process in which (a) the diisocyanate is reacted with a polyhydroxyl compound (b) at an equivalent ratio of isocyanate groups to isocyanate-reactive groups (i.e., active hydrogens) greater than 1.3:1. The resulting NCO prepolymer thus obtained is then reacted with (c) a compound having one or more epoxide groups and an active hydrogen. The temperatures at which the reactions are carried out are generally in the range from 25° C. to 100° C., preferably at room temperature. The reactions can be carried out in the presence or even in the absence of suitable inert solvents.

Generally, the NCO prepolymer has the structural formula:

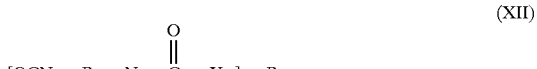 (XII)

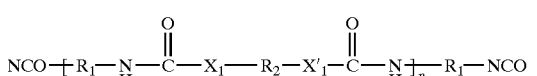 (XIII)

where the constituent elements are as defined above.

The resulting NCO prepolymer is then reacted with two equivalents of an epoxide-containing compound, which also contains at least one active hydrogen, preferably corresponding to the formula:

 (XIV)

$$X_4-R_4$$

where $X_4$ is an active hydrogen-containing group corresponding to the formula HX2—; where the H is an active hydrogen; and $R_4$ and $X_2$ are as defined above.

The epoxide compound (c) is any compound having one or more epoxide groups and at least one active hydrogen atom which can react with isocyanates. Preferred for component (c) are epoxide compounds where the active hydrogen-containing group is —COOH, or —NHR where R is a lower alkyl or hydrogen, and especially preferred where the active hydrogen-containing group is —OH. Most preferred epoxide compounds include glycidol and glycerol diglycidyl ether.

Other suitable epoxide and active hydrogen containing compounds (component c) include, but are in no way limited to, those compounds having the structures:

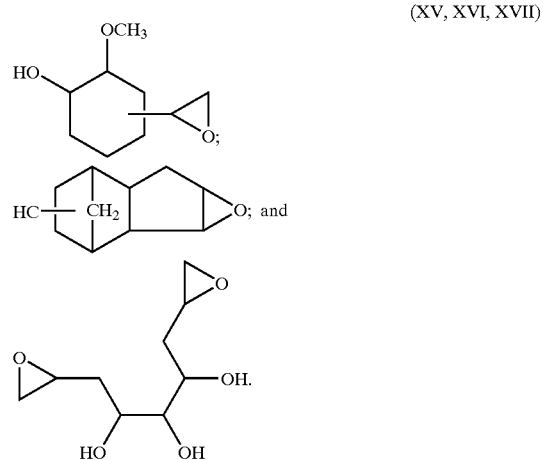 (XV, XVI, XVII)

In addition, further auxiliaries and/or additives (d) can optionally be added to the formative components in the preparation of the EPUs of the present invention. Examples include blowing agents, lubricants, inhibitors, stabilizers against hydrolysis or discoloration, dyes, pigments, inorganic and/or organic fillers and reinforcers.

These auxiliaries and/or additives can be introduced into the formative components or into the reaction mixture for preparing the EPUs. The auxiliaries and/or additives which can be used may be found in the specialist literature, for example the monograph by J. H. Saunders and K. C. Frisch "High Polymers," Volume XVI, Polyurethane, Parts 1 and 2

(Interscience Publishers 1962 and 1964), the Kunststoff-Handbuch, Volume 7, Polyurethane 1st, 2nd and 3rd Editions (Carl Hanser Verlag, 1966, 1983 and 1993) or DE-A-29 01 774.

4. The Cross-linking Agent

The cross-linking agent can be aliphatic amines, aromatic amines, carboxylic acid anhydrides, thiols, alcohols, phenols, isocyanates, tertiary amines, boron complexes, inorganic acids, hydrazides, imidazoles and their derivatives, and modified products thereof Preferred hardeners are liquid imidazole or anhydrides because they provide the formulations with lower viscosity.

The cross-linking or hardening agent is preferably in liquid form. If a solid hardening agent is employed, such should be melted when added to the composition. Examples of suitable anhydride hardeners are methyltetrahydrophthalic anhydride, hexahydrophthalic anhydride, hexahydro-4-methylphthalic anhydride maleic anhydride, trimellitic anhydride, pyromellitic cianhydride, tetrahydrophthalic anhydride, phthalic anhydride, norbornenedicarboxylic anhydride, nadic methyl anhydride, and methylcyclohexane-1, 2 dicarboxylic anhydride. Additional suitable anhydrides which are known in the art can be found, for instance, in H. Lee and K. Neville, *Handbook of Epoxy Resin*, McGraw Hill (1967), Chapter 12, the disclosure of which is incorporated herein by this reference and made a part hereof. Preferred organic carboxylic acid anhydride hardeners include hexahydrophthalic anhydride, methyl hexahydrophthalic anhydride, and mixtures thereof.

The cross-linking agent is present at about 1 to 50 weight % of the adhesive composition.

5. The Adhesion Promoter

The composition further contains an adhesion promoter, most preferably an organofunctional silane adhesion promoter. The adhesion promoter promotes adhesion between the substrate and the adhesive composition.

The silane material preferably, but not necessarily, contains the amine, epoxy, or vinyl functionality to increase its compatibility with the composition, but most any organo-functional silane may be used. Suitable classes of silanes include alkylchlorosilanes, dialkyldichlorosilanes, alkyltrichlorosilanes; organosilane esters; vinylsilanes; aminoalkylsilanes; diaminoalkylsilanes; styrylaminosilanes; ureidoalkylsilane esters; epoxyalkylsilane esters; alkoxysilanes; acryloxyalkylsilane esters; methacryloxyalkylsilane esters; and mercaptoalkylsilane esters, and combinations thereof.

Specific examples of suitable silanes include, but are not limited to, vinyltrichlorosilane; methyltrichlorosilane; ethyltrichlorosilane; methyldichlorosilane; dimethyldichlorosilane; methylvinyldichlorosilane; methyltriethoxy silane; methyltrimethoxysilane; vinyltriethoxysilane; vinyltrimethoxysilane; vinyl-tris-(2-methoxyethoxysilane); vinyltriacetoxysilane; gamma-methacryloxylpropyltrimethoxysilane; gamma-methacryloxypropyl-tris-(2-methoxyethoxy)silane; beta-(3, 4-epoxycyclohexyl)ethyltrirnethoxysilane; gamma-glycidoxypropyl-trimethoxysilane; gamma-mercaptopropyltriethoxysilane; gammamercaptopropyltrimethoxysilane; gamma-aminopropyltriethoxysilane; gamma-aminopropyltrimethoxysilane; N-beta-(aniinoethyl)-gamma-amninopropyltrimethoxysilane; triaminoflnctional silane; gamma-ureidopropyltriethoxysilane; N-(2-aminoethyl)-3-aminopropyltrimethoxysilane; N-[2-(vinylbenzylamino)ethyl]-3-aminopropyltrimnethoxysilane and 3-chloropropyltrimethoxysilane. Preferred silanes include A-1100, gamma-aminopropyltriethoxysilane, from Union Carbide, Danbury, Conn.; A-174, gamma-methacryloxypropyltrimethoxysilane, also from Union Carbide; and Z-6040 glycidoxypropyltrimethoxysilane, from Dow Corning Corporation, Midland, Mich. It is believed that any organofinctional silane may be used, so long as it is soluble in the reaction mixture and does not interfere with the curing of the composition.

The silane component comprises from a small but effective amount, i.e., about 0.02% by weight of the basic composition, up to about 10.0% by weight of the composition. Optimally, about 0.1% to about 2.0% of silanc are used.

6. The Conductive Filer

The conductive filler may be (1) any kind of solid metal or metal oxide particles such as nickel, copper, aluminum, palladium, silver, gold, platinum and other alloys and (2) carbon black, carbon fiber, and graphite. The preferred metallic fillers are silver flakes because they are highly electrically conductive, relatively cheaper compared to gold, and silver oxide is highly electrically conductive.

The conductive adhesive composition of present invention comprises 5 to 95 weight %, preferably 50 to 80% for metal fillers and 10 to 50% for carbon black, carbon fiber and graphite fillers.

7. The Optional Epoxy Resins

Suitable epoxy resins include cycloaliphatic epoxys, bisphenol A, bisphenol F, biphenyl, naphthalene, novolac resins, and compounds of the general formula:

where R is selected from the group consisting of

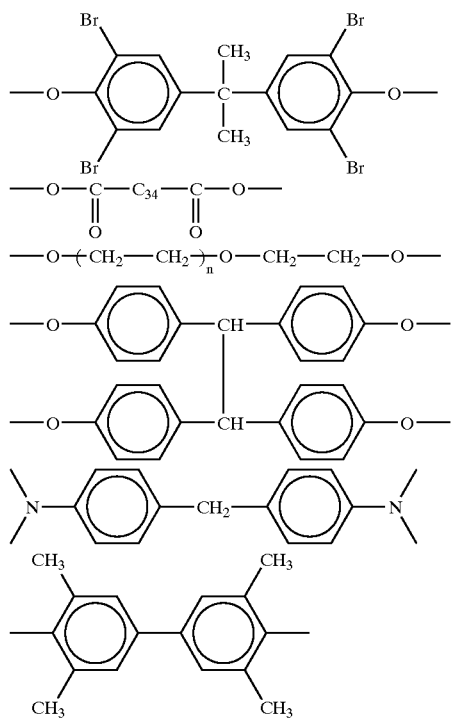

The preferred epoxy resins are cycloaliphatic epoxy resins.

The cycloaliphatic type epoxides employed as the preferred epoxy resin ingredient in the invention are selected from non-glycidyl ether epoxides containing more than one 1,2 epoxy group per molecule. These generally are prepared by epoxidizing unsaturated cyclic hydrocarbon compounds, such as cyclo-olefins, using hydrogen peroxide or peracids such as peracetic acid and perbenzoic acid. The organic peracids generally are prepared by reacting hydrogen peroxide with either carboxylic acids, acid chlorides or ketones to give the compound R—COOOH. These materials are well known in the art and reference may be made to Brydson, J., *Plastic Materials* (1966) 471, incorporated herein by this reference and made a part hereof, for their synthesis and description.

Such non-glycidyl ether cycloaliphatic epoxides are characterized by having a ring structure wherein the epoxide group may be part of the ring or may be attached to the ring structure. These epoxides also may contain ester linkages. The ester linkages generally are not near the epoxide group and are relatively inert to reactions. Examples of non-glycidyl ether cycloaliphatic epoxides include 3,4-epoxycyclohexylrnethyl-3,4-epoxycyclohexane carboxylate (containing two epoxide groups which are part of the ring structures, and an ester linkage); vinylcyclohexene dioxide (containing two epoxide groups, one of which is part of a ring structure); 3,4-epoxy-6-methyl cyclohexyl methyl-3,4-epoxycyclohexane carboxylate and dicyclopentadiene dioxide, having the following respective structures:

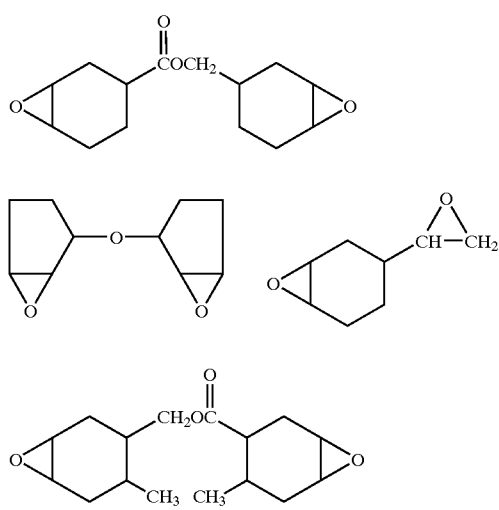

Many of the cycloaliphatic epoxides are characterized by the location of the epoxy group(s) on a ring structure rather than on an aliphatic side chain. Generally, the cycloaliphatic epoxide particularly useful in this invention will have the formula selected from the group consisting of:

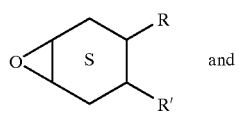 and

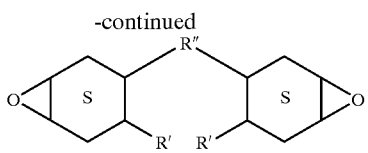

where S stands for a saturated ring structure; R is selected from the group consisting of $CHOCH_2$, $O(CH_2)_n CHOCH_2$ and $OC(CH_3)_2 CHOCH_2$ radicals where n=1 to 5; R' is selected from the group consisting of hydrogen, methyl, ethyl, propyl, butyl, and benzyl radicals; and R" is selected from the group consisting of O, $CH_2OOC$, and $CH_2OOC(CH_2)_4COO$ radicals.

These cycloaliphatic epoxy resins may be characterized by reference to their epoxy equivalent weight, which is defined as the weight of epoxide in grams which contains one equivalent of epoxy. Suitable cycloaliphatic epoxy resins have a preferred epoxy equivalent weight from about 50 to about 250. They generally will have a viscosity between about 5 to about 900 cps at 25 degrees C.

Examples of suitable cycloaliphatic epoxides which are known in the art are suggested in U.S. Pat. Nos. 5,194,930; 3,207,357; 2,890,194; 2,890,197; and 4,294,746, disclosures of which are incorporated herein by this reference and made a part hereof. Some specific examples of suitable cycloaliphatic epoxides are: 3,4-epoxycyclohexylmethyl-3,4-epoxycyclohexane carboxylate available from the Union Carbide under the trade designation ERL-4221; bis (3,4-epoxycyclohexyl) adipate, having the following structure:

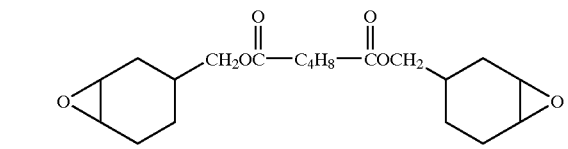

and available from Union Carbide under the trade designation ERL-4299; and vinyl cyclohexene diepoxide, available from Union Carbide under the trade designation ERL-4206.

A discussion of various suitable cycloaliphatic epoxides which are known in the art can be found in the publication entitled *Cycloaliphatic Epoxide Systems*, Union Carbide (1970), the disclosure of which is also incorporated herein by this reference and made a part hereof. Mixtures of cycloaliphatic epoxides can be employed when desired. The most preferred epoxide is 3,4-epoxycyclohexylmethyl-3,4-epoxycyclohexane carboxylate.

The bisphenol A type epoxides employed as the preferred resin ingredient in the invention are selected from glycidyl ether epoxides containing more than one 1,2 epoxy group per molecule. They are prepared according to methods known in the art by the reaction of 1 mole bisphenol and 2 mole epichlorohydrin in basic media Generally, the bisphenol A type epoxide particularly useful in this invention will have the formula represented by:

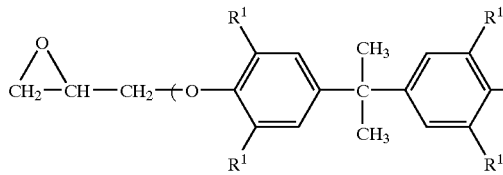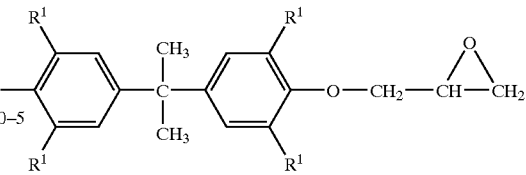

where $R^1$ is H, Br or $CH_3$. The preferred bisphenol A type epoxides in this invention are 2,2-bis(4-hydroxyphenyl) propane-epichlorohydrin copolymer ($R^1$=H) and 2,2'-{(3, 3',5,5'-tetramethyl{1,1'-biphenyl}-4,4'diyl) bis (oxymethylene)}bisoxirane ($R^1$=$CH_3$), and mixtures thereof. The epoxy equivalent weight for the two epoxy resins ranges from about 100 to about 300. Bisphenol F type expoxides are also suitable for use in the present invention.

The epoxy novolac resin employed as the preferred resin ingredient in the invention is selected from glycidyl ether epoxides containing more than one 1,2 epoxy group per molecule. They are prepared according to methods known in the art by the reaction of phenolic resin and epichlorohydrin in basic media. Generally, the epoxy novolac resin particularly useful in this invention will have the formula represented by:

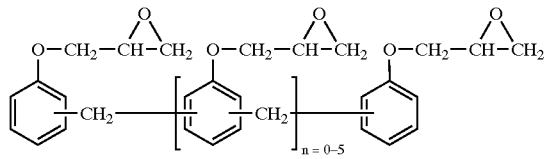

The preferred epoxy novolac resin in this invention is poly(phenyl glycidyl ether)-co-formaldehyde. The epoxy equivalent weight for this epoxy novolac resin ranges from about 200 to about 500.

8. The Optional Catalysts

A catalyst, or curing accelerator, is a substance that increases, catalytically, the hardening rate of a synthetic resin. The catalyst is selected to make the curing reaction occur at the desired temperature range. It has been found that the selection of the catalyst can influence the latency of the underfill formulation. Imidazolium salts, imidazoles, onium-borate compounds, tertiary amines, ureas, and metal acetylacetonates are suitable catalysts in the present invention to obtain a successful adhesive material.

The catalytic mechanism of imidazolium salts in epoxidelanhydride systems is similar to imidazole because the imidazolium salt is decomposed into imidazole with the aid of trace moisture at a temperature of 180 to 200° C. Imidazolium salts suitable for use in this invention are characterized by the general formula:

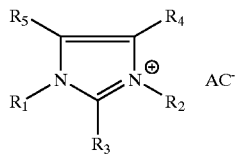

where $R_1$, $R_2$, $R_3$, $R_4$, and $R_5$, can be the same or different and are selected from the group consisting of H, $C_{1-6}$ alkyls, and phenyl. The anionic counter ion $AC^-$ can be any suitable anionic moiety. Preferably, $AC^-$ is selected from the group consisting of $OAC^-$, $AcAc^-$, $C_{1-6}$ alkyl substituted $OAc^-$, $C_{1-6}$ alkyl substituted $I^-$, $BF_4^-$, $PF_6^-$, $AsF_6^-$, $SbF_6^-$, and $CF_3SO_3^-$. The preferred imidazolium compounds are $R_4$=$R_5$=H; $R_1$, $R_2$, and $R_3$ are selected from the group consisting of H, methyl, ethyl, butyl, and phenyl; and $AC^-$ is selected from the group consisting of $I^-$ and $PF_6^-$ and $BF_4^-$.

The general chemical structure of metal acetylacetonate is:

$$[CH_3COCH=C(O^-)CH_3]_xM^{y+}$$

where $M^{y+}$ is selected from the group consisting of the transition metals. X is the ligancy of $[CH_3COCH=C(O^-)CH_3]$ to $M^{y+}$. Y is the number of positive charge of M and is 1 to 6, and will be equal to X. Examples of suitable metal acetylacetonates include cobaltous ($Co^{2+}$) acetylacetonate, cobaltic ($Co^{3+}$) acetylacetonate, coppric, copprous and ferric ($Fe^{3+}$) acetylacetonate. The mechanism by which metal acetylacetonate catalyzes epoxy/anhydride systems is not currently clear, but its catalytic behavior was reported by J. D. B. Smith, J. Appl. Polym. Sci., Vol. 26, 979–986 (1981).

The general chemical structure of onium-borate is:

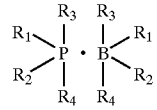

where $R_1$, $R_2$, $R_3$, $R_4$, can be the same or different, and are selected from the group consisting of $C_{1-10}$ alkyls and phenyl. The preferred onium-borate is $R_1$=$R_2$=$R_3$=phenyl; and $R_4$ is selected from the group consisting of phenyl and $C_{1-10}$ alkyls.

Suitable tertiary amines include, for example, triethyl amine, diaza-bicyclo-(2,2,2)-octane, 1,5diaza-bicyclo-(4,3,0)-non-5-ene, 1,8diaza-bicyclo-(5,4,0)undec-7-ene, dimethyl aniline, dimethyl benzyl amine, pyridine, 2-, 3-, 4-picoline, N,N-diethyl aniline, quinoline, N-methyl piperidine, N-methyl dicyclohexyl amine, N,N-dimethyl cyclohexyl amine, N-cyclohexyl piperidine, N-cyclohexyl morpholine and 2,6-, 2,4-lutidine.

The composition of the present invention can contain about 0 to 10 weight % catalyst; more preferably, 0 to 2 weight %.

9. The Optional Diluent

The composition may be prepared either in the absence of or in the presence reactive or nonreactive diluent. The use of a diluent is preferred in formulations with high viscosity. Suitable nonrective diluents include, for example, aliphatic and cycloaliphatic hydrocarbons, halogen containing hydrocarbons such as methylene chloride, chloroforn, di- and tri-chlorethylene, aromatic hydrocarbons, such as benzene, toluene, xylene, halogenated aromatic hydrocarbons such as chlorobenzene, dichlorobenzene, and trichlorobenzene, dioxane, ethyl acetate, ethyl glycol acetate, acetone, acetonitrile, dimethyl formamide and mixtures of these solvents. Exemplary reactive diluents are glycidyl ethers.

The diluent can be present 0 to 50% by weight of the composition.

The electrically conductive adhesive composition of the present invention can be prepared using conventional resin/paste mixing/blending equipment. The compositions are optionally prepared utilizing a conventional three-roll mill. Typically the resin components, including the epoxide-modified polyurethane, hardener, adhesion promoter, optional epoxy resin, and optional catalyst are first blended ant the resulting resin composition blend is combined with the conductive filler. The resulting conductive adhesive paste is cured and then tested for impact performance and contact resistance shift during elevated temperature and humidity aging.

The invention is exemplified by the following non-limiting examples.

EXAMPLE 1

Preparation of an Epoxide-modified Polyurethane (EPU): 2 equivalents of 4,4'-diphenylmethane diisocyanate (MDI) and 1 equivalent polyTBF 2000 (PolyTBF 2000 from BASF) were added to a three-neck flask with a mechanical stirrer and a nitrogen inlet. The mixture was stirred at room temperature for about 5 hours. Then 2 equivalents of glycerol diglycidyl ether were added and mixed. The reaction was continued for another 15 hours at room temperature. As described in Example 2, the resulting product was an EPU useful in making electrically conductive adhesives.

EXAMPLE 2

Formulating Conductive Adhesives: An electrically conductive adhesive composition utilizing the EPU according to present invention prepared in Example 1 was prepared having the following composition:

| Component | Weight (parts) |
| --- | --- |
| EPU resin | 40.0 |
| RSL 1738 | 10.0 |
| MHHPA | 9.0 |
| 2-ethyl-4-methylimidazole | 0.5 |
| SILQUEST A-187 | 1.0 |
| Ag flake | 242.0 |

The EPU resin was prepared as detailed in Example 1. RSL 1738 is a bispehnol F type epoxy resin with an epoxy equivalent weight of 171. It is a product of Shell Chemical Company. MHHPA is methylhexahydrophthalic anhydride available from Aldrich Chemical Company. SILQUEST A-187 is a silane from OSI Specialties. The Ag flake is a product of Degussa Corporation. The EPU resin, RSL1738, MHHPA, 2-ethyl-4methylimidazole, and SILQUEST A-187 were blended first to form a resin and then mixed with the Ag flake. The mixture of the resin and the Ag flake was mixed using a three-roll mill until they formed a homogeneous paste.

EXAMPLE 3

Impact Performance Test. Drop tests were done based on the standard procedure set by National Center of Manufacturing and Science (NCMS). 44 I/O plastic leaded chip carriers, PLCC 44 with J leads, were used in this test. FR4 printed circuit boards (PCB) which were coated either with Sn/Pb or copper and had dimensions of 4 cm wide and 8 cm long. A layer of conductive adhesive paste (6 mil thick) was dispensed on the PCB, and then placed the PLCC 44 on the patch of adhesives paste. The samples were cured at 150° C. for one hour. After the samples were kept at room temperature for 72 hours, drop test was conducted.

Current drop test standard is that if a package can pass 6 drops from a certain height to a vinyl coated concrete floor vertically without the component failing apart from the PCB, then it is defined that the conductive adhesive passes the drop test. Currently, drop test height recommended by industry is 36 inches for general applications, but 60 inches for telecommunication applications. In order to ensure that the package hit the floor on one edge of the board vertically, a channel is used. All of our conductive adhesive samples were dropped from a 36-inch height for 6 times and then dropped from a 60-inch height for another 6 times. The conductive adhesive of present invention passed 6 drops from 36 inches followed by six drops from 60 inches on both Sn/Pb and copper-coated boards.

It is to be understood that any of the components and conditions mentioned as suitable herein can be substituted for its counterpart in the foregoing examples and that although the invention has been described in considerable detail in the foregoing, such detail is solely for the purpose of illustration. Variations can be made in the invention by those skilled in the art without departing from the spirit and scope of the invention except as it may be limited by the claims.

What is claimed is:

1. A method of joining electrically conductive materials comprising the step of applying an electronically conductive adhesive composition to at least one of said electrically conductive materials, wherein the adhesive composition consists of;

an epoxide-modified polyurethane resin having the following structure

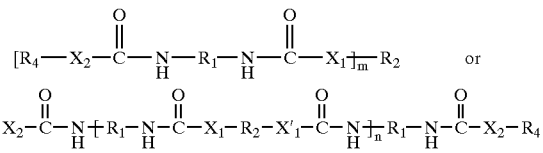

where m is 2 or 3; n is one or greater; $R_1$ is an aliphatic hydrocarbon radical, a cycloaliphatic hydrocarbon radical, an aromatic hydrocarbon radical, or an araliphatic hydrocarbon radical; $R_2$ is an aliphatic hydrocarbon radical, a cycloaliphatic hydrocarbon radical, an alkoxy radical, a polyester, or a polyether; $R_4$ is either:

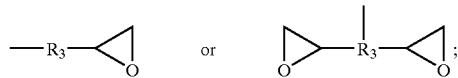

$R_3$ is an aliphatic hydrocarbon radical, a cycloaliphatic hydrocarbon radical, an alkoxy radical, a polyester, or a polyether; and $X_1$, $X'_1$ and $X_2$ are either a single bond, —O—; —COO—; —NH—; or —S—;

a carboxylic acid anhydride as a cross-linking agent;

an adhesion promoter; and a conductive filler; joining the electrically conductive material(s) with the applied adhesive to a substrate; and curing the adhesive.

2. The method of claim 1, wherein the electrically conductive materials are present on a printed circuit board.

3. The method of claim 1, wherein the adhesion promoter is selected from the group consisting of alkylchlorosilanes, dialkyldichlorosilanes, alkyltrichlorosilanes; organosilane esters; vinylsilanes; aminoalkylsilanes; diaminolkylsilanes; styrylaminosilanes; ureidoalkylsilane esters; alkoxysilanes; acryloxyalkylsilane esten; methacryloxyalylsilane esters; and mercaptoalkylsilane esters, and combinations thereof.

4. The method of claim 1, wherein the adhesion promoter is (3-glycidoxypropyl)trimethoxysilane.

5. A method of joining electrically conductive materials, comprising: applying an electrically conductive adhesive composition to at least one of said electrically conductive materials, wherein said electrical conductive adhesive composition consists of an epoxide-modified polyurethane resin, a cross-linking agent, an adhesion promoter, and a conductive filler, wherein said epoxide-modified polyurethane resin has the following structure:

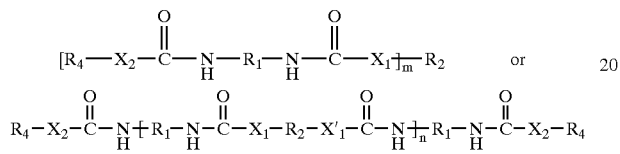

where m is 2 or 3; n is one or ; $R_1$ is an aliphatic hydrocarbon radical, a cyloaliphatic hydrocarbon radical, an aromatic hydrocarbon radical, or an araliphatic hydrocarbon radical; $R_2$ is an aliphatic hydrocarbon radical, a cycloaliphatic hydrocarbon radical, an alkoxy radical, a polyester; or a polyether; $R_4$ is either:

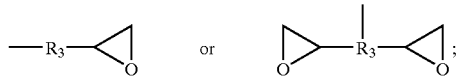

$R_3$ is an aliphatic hydrocarbon radical, a cycloaliphatic hydrocarbon radical, an alkoxy radical, a polyester, or a polyether; and $X_1$, $X_1$ $X'_1$ and $X_2$ are either a single bond, —O—; —COO—; —NH—; or —S—; joining the electrically conductive material(s) with the applied adhesive to a substrate; and curing the adhesive.

6. The method of claim 5 wherein said electrically conductive materials are at least one of the following; a chip and a printed circuit board.

* * * * *